(12) United States Patent
Yamamoto (10) Patent No.: US 7,298,482 B2
(45) Date of Patent: Nov. 20, 2007

(54) EXPOSURE APPARATUS AND ALIGNING METHOD

(75) Inventor: Kiyohito Yamamoto, Tochigi (JP)

(73) Assignee: Canon Kabushiki Kaisha, Tokyo (JP)

( * ) Notice: Subject to any disclaimer, the term of this patent is extended or adjusted under 35 U.S.C. 154(b) by 132 days.

(21) Appl. No.: 11/133,258

(22) Filed: May 20, 2005

(65) Prior Publication Data

US 2005/0219533 A1    Oct. 6, 2005

Related U.S. Application Data

(62) Division of application No. 10/762,372, filed on Jan. 23, 2004, now Pat. No. 6,952,262.

(30) Foreign Application Priority Data

Jan. 29, 2003  (JP)  ............................. 2003-021037

(51) Int. Cl.
G01B 11/00 (2006.01)
G03B 27/42 (2006.01)
G03F 9/00 (2006.01)
G03C 5/00 (2006.01)
G01N 21/86 (2006.01)

(52) U.S. Cl. ................... 356/401; 355/53; 430/22; 430/30; 250/548

(58) Field of Classification Search .................. None
See application file for complete search history.

(56) References Cited

U.S. PATENT DOCUMENTS

| | | | |
|---|---|---|---|
| 5,026,166 A * | 6/1991 | van der Werf | 356/401 |
| 5,959,721 A * | 9/1999 | Nishi | 355/53 |
| 6,414,744 B1 | 7/2002 | Kuiper et al. | 355/75 |
| 6,544,805 B2 | 4/2003 | Holcman et al. | 438/14 |
| 6,577,382 B2 | 6/2003 | Kida et al. | 355/77 |
| 6,897,963 B1 * | 5/2005 | Taniguchi et al. | 356/500 |
| 6,952,262 B2 * | 10/2005 | Yamamoto | 356/401 |
| 7,079,222 B2 * | 7/2006 | Sato | 355/53 |

FOREIGN PATENT DOCUMENTS

| | | |
|---|---|---|
| EP | 0 989 596 A1 | 3/2000 |
| JP | 11-111611 | 4/1999 |
| JP | 2000-349022 | 12/2000 |

\* cited by examiner

Primary Examiner—Gregory J. Toatley, Jr.
Assistant Examiner—Gordon J. Stock, Jr.
(74) Attorney, Agent, or Firm—Fitzpatrick, Cella, Harper & Scinto (57) ABSTRACT

An exposure apparatus for aligning a substrate and performing exposure using the aligned substrate. The apparatus includes a first alignment system, having a first stage and a first image sensing unit, to detect a position of a first mark on the substrate on the first stage using the first image sensing unit, a transfer system to transfer the substrate, on which the position of the first mark has been detected by the first alignment system, from the first stage onto a second stage, and a second alignment system, having the second stage and a second image sensing unit of which magnification is higher than that of the first image sensing unit, to detect a position of a second mark on the substrate on the second stage using the second image sensing unit, and to align the substrate based on the detection obtained by using the second image sensing unit. The first and second alignment systems and the transfer system are arranged such that the second mark on the substrate transferred on the second stage is positioned within a view of the second image sensing unit.

19 Claims, 8 Drawing Sheets

EXPOSURE APPARATUS AND ALIGNING METHOD

This application is a divisional application of U.S. patent application Ser. No. 10/762,372, filed Jan. 23, 2004 now U.S. Pat. No. 6,952,262.

FIELD OF THE INVENTION

The present invention relates to an aligning apparatus preferably applicable to reticle alignment in a semiconductor exposure apparatus.

BACKGROUND OF THE INVENTION

In a semiconductor exposure apparatus, the accuracy of alignment of a reticle and a wafer is significant in the performance, which directly influences the apparatus capability. In the exposure apparatus, a circuit pattern drawn on a reticle must be precisely overlaid on each shot area pattern on a wafer, and thus, different circuit patterns must be overlaid in multiple layers on the wafer. To obtain such high overlay accuracy, it is necessary to always accurately align the reticle and the wafer. Generally, in the exposure apparatus, the respective wafer and reticle substrates are aligned with their respective stages for high-accuracy alignment therebetween. For this purpose, the accuracy of alignment of the reticle and wafer stages is also significant.

For example, alignment of a reticle with the reticle stage is made by overlaying a reticle mark provided on a reticle lower surface on a reference mark provided on the reticle stage and measuring the overlaid marks. That is, the reticle is placed on the reticle stage, then the reticle and/or the reticle stage is moved to a position where a predetermined relative positional relation can be obtained between the reticle marks and the reference mark. Thereby, alignment is made.

Figure 1:
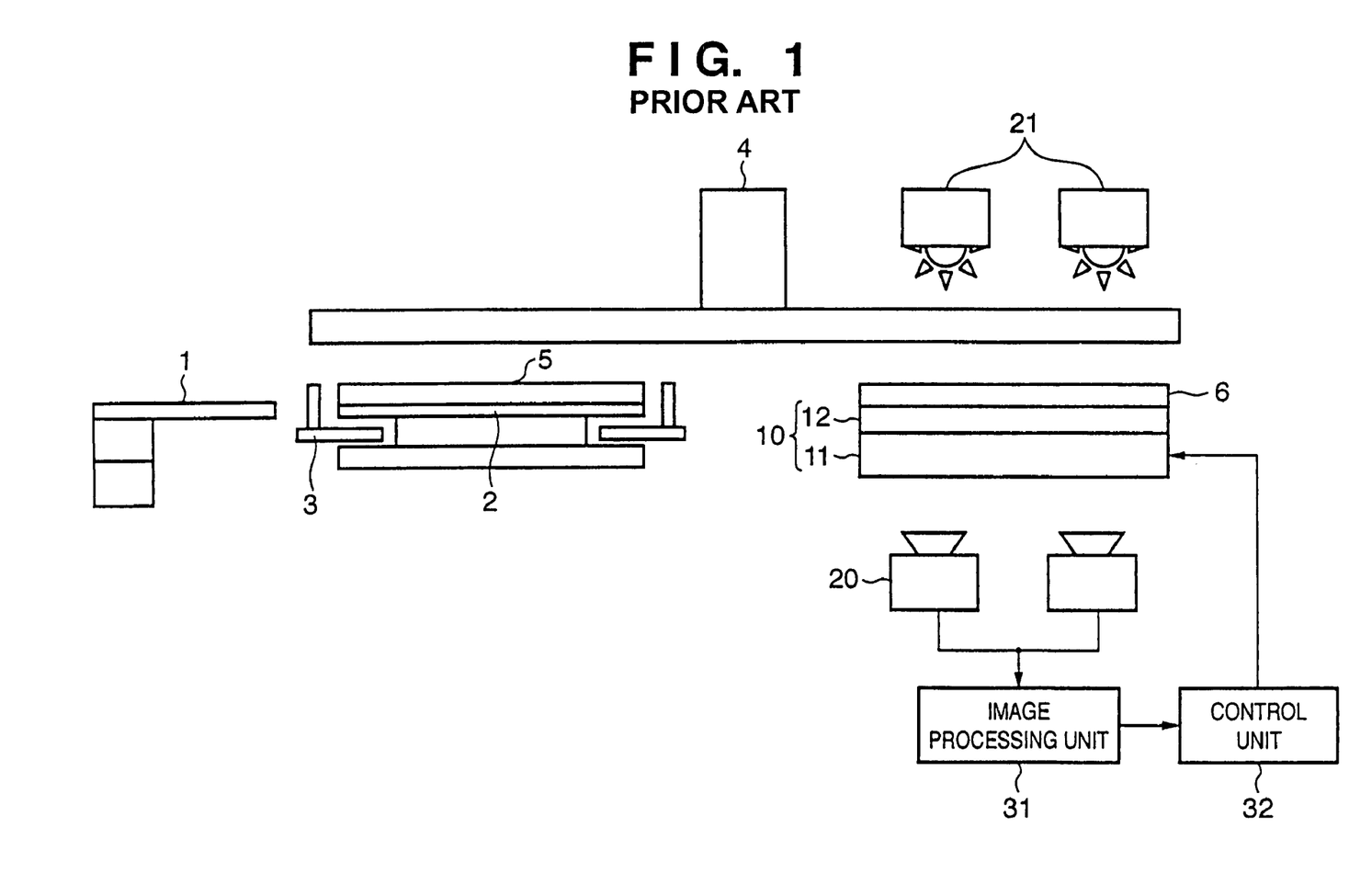
FIG. 1 is a schematic diagram showing reticle transfer and a reticle aligning mechanism in a general exposure apparatus.

Conventionally, a system to realize the above alignment has a construction as shown in FIG. 1. A reticle 5, supplied from a reticle transfer robot 1, is aligned based on an outer form shape by using thrust pins 3 in a reticle holder 2. Then, the reticle 5 is supplied by a reticle exchange hand 4 onto a reticle stage 10, and is aligned with the reticle stage 10. Numerals 20 and 21 denote measurement cameras and illumination LEDs for image sensing the reticle mark and a reference mark. An image processing unit 31 measures the positions of these marks using the obtained image data. The result of position measurement is used for reticle alignment. In this example, the result of the measurement is reflected in a reticle stage driver 11 through a control unit 32. A reticle holder 12 on the reticle stage 10, in the aligned state, holds the reticle 6. Thereby, the alignment of the reticle is realized.

However, in an initial status of the above alignment, if the positions of the reference mark and the reticle mark are unknown, a search for the mark positions must be performed. Thus, the throughput of the apparatus is seriously delayed. Generally, the position of the reference mark of the stage can be grasped by the apparatus itself. However, the position of the reticle mark differs by each reticle. Accordingly, to improve the throughput of the apparatus, rough alignment, called prealignment, is performed so as to find the reticle mark position.

Japanese Published Unexamined Patent Application No. 2000-349022 proposes a system to efficiently realize this prealignment. According to the system, the prealignment is performed in parallel with setup processing such as inspection of reticle contamination and generation of inventory. Thereby, the throughput is improved. However, in this system, as a four-cell detector fixed to a rotary part of a reticle exchange hand is used as a means for measurement of prealignment, the accuracy of alignment is the same on the reticle supply side and the reticle stage side. Further, in this system, it is difficult to attain high accuracy.

SUMMARY OF THE INVENTION

The present invention has as an object to realize substrate alignment with high alignment accuracy so as to attain high throughput.

According to the present invention, the foregoing object is attained by providing an exposure apparatus which performs alignment on a substrate on first and second stages, and performs predetermined exposure processing using the substrate aligned on the second stage. The apparatus comprises: a first alignment unit to detect a position of a mark on a substrate placed on the first stage by using a first image sensing unit, and to perform alignment on the substrate based on the result of the detection; a transfer unit to transfer the substrate, aligned by the first alignment unit, from the first stage onto the second stage; and a second alignment unit to detect the position of the mark on the substrate placed on the second stage by using a second image sensing unit having a higher magnification than that of the first stage, and to perform alignment of the substrate based on the result of the detection.

Also, according to another aspect of the present invention, there is provided an aligning method for aligning a substrate by using first and second stages. The method comprises a first alignment step of detecting a position of a mark on a substrate placed on the first stage by using a first image sensing unit, and performing alignment on the substrate based on the result of the detection; a transfer step of transferring the substrate, aligned in the first alignment step, from the first stage to the second stage by a transfer unit; and a second alignment step of detecting the position of the mark on the substrate placed on the second stage by using a second image sensing unit having a higher magnification than that of the first stage, and to perform alignment of the substrate based on the result of the detection.

Other features and advantages of the present invention will be apparent from the following description taken in conjunction with the accompanying drawings, in which like reference characters designate the same name or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

DETAILED DESCRIPTION OF THE PREFERRED EMBODIMENTS

Preferred embodiments of the present invention will now be described in detail in accordance with the accompanying drawings.

In the embodiment described below, the present invention is applied to a reticle alignment mechanism in an exposure apparatus. In the exposure apparatus, prealignment for a reticle to be aligned is performed in parallel with an exposure processing operation, thereby, reticle exchange time is reduced, and high throughput is realized.

First Embodiment

Figure 2:
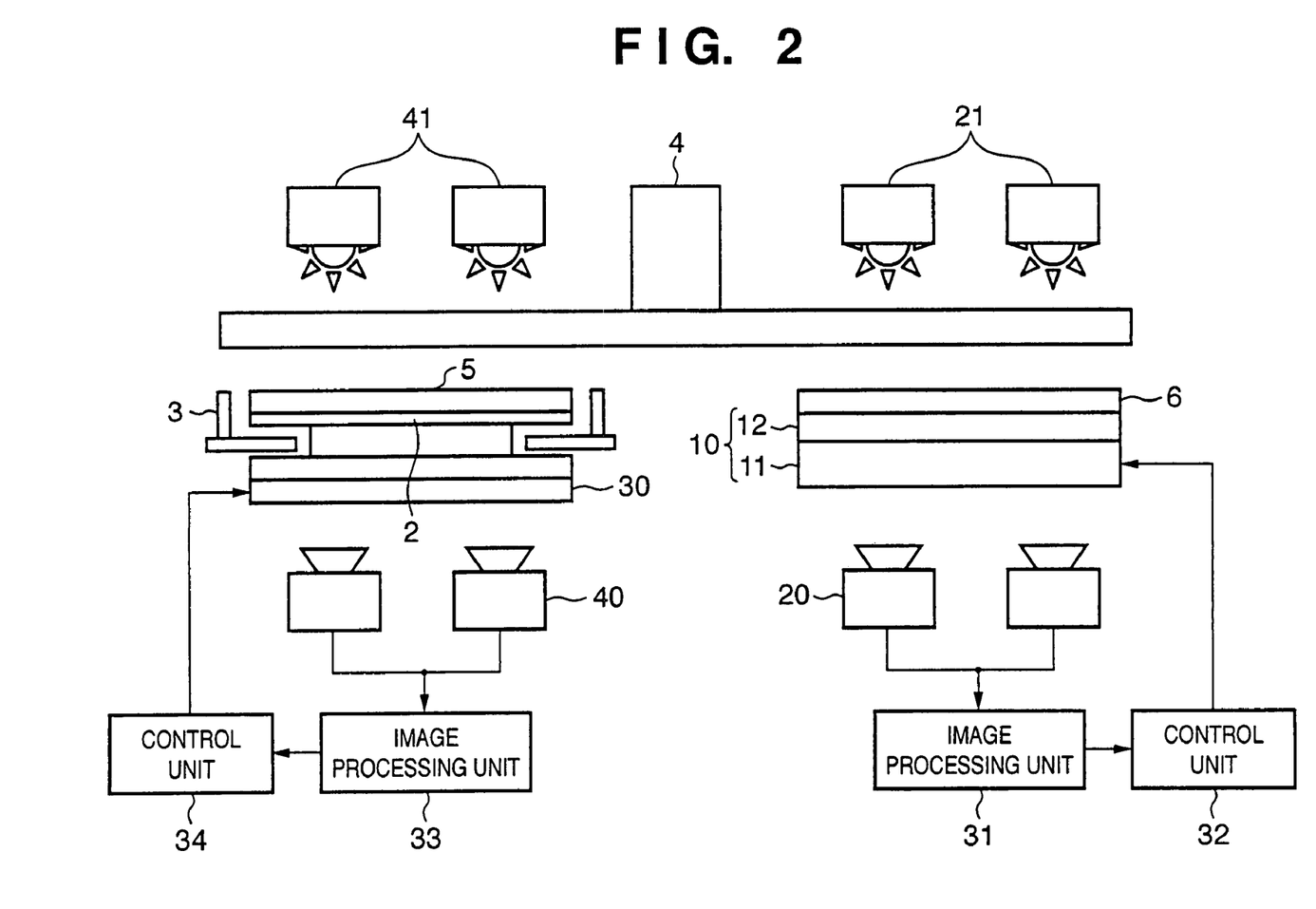
FIG. 2 is a schematic diagram showing the reticle aligning mechanism according to a first embodiment of the present invention.

FIG. 2 is a schematic diagram showing a reticle aligning mechanism according to a first embodiment of the present invention. As described above, the present embodiment is applied to an exposure apparatus, however, for the purpose of detailed explanation of the reticle aligning mechanism, elements of the exposure apparatus such as a projection optical system and a wafer stage are omitted in FIG. 2.

In addition to the conventional construction as shown in FIG. 1, a stage 30 for prealignment, image sensing units 40 and illumination LEDs 41 constituting an image sensing mechanism are provided. Note that the reticle transfer robot 1 is omitted from the figure. Further, the image sensing units 20 and the illumination LEDs 21 will be referred to as a first image sensing mechanism, and the image sensing units 40 and the illumination LEDs 41, as a second image sensing mechanism. The prealignment stage 30 is a stage driven by, e.g., an XYθ three-axis linear motor. The image sensing units 20 and 40 are, e.g., CCD cameras. The first image sensing mechanism (20, 21) and the second image sensing mechanism (40, 41) are fixed on the same non-movable element (not shown). Thus, the reference positions of both image sensing units (20, 40) are fixed to predetermined measurement coordinate positions, such as measurement centers of cameras.

The reference positions on the reticle holder 12 on the reticle stage 10 are brought into correspondence with the reference position of the image sensing units 20, and the reference positions on the reticle holder 2 on the prealignment stage 30 are brought into correspondence with the reference positions of the image sensing units 40. Thus, the relative positions of the reticle holder 2, holding the reticle 6, and the reticle holder 12, are clearly obtained.

Figure 8:
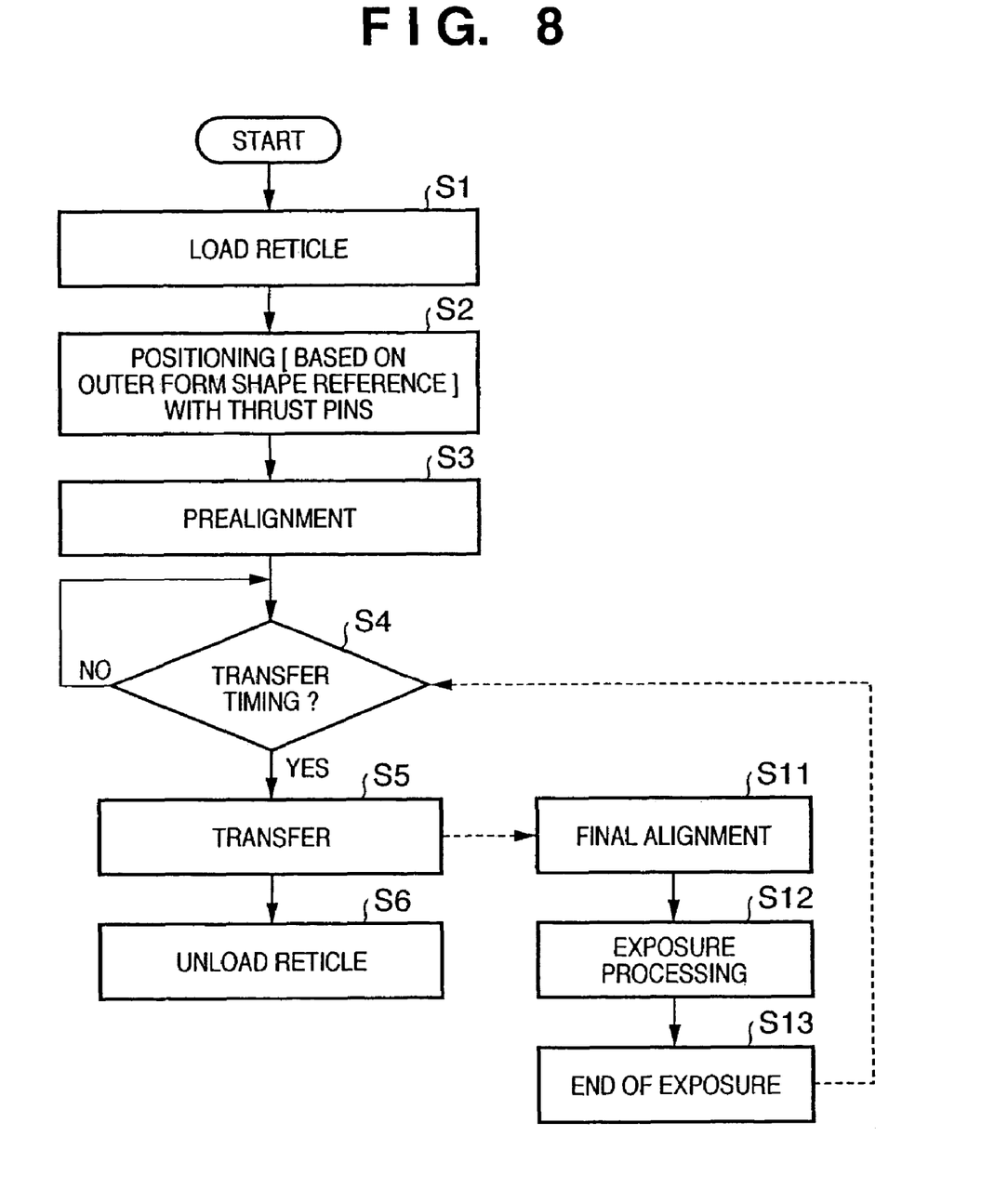
FIG. 8 is a flowchart showing an exposure processing procedure according to the first embodiment.

FIG. 8 is a flowchart showing reticle alignment processing in the exposure apparatus according to the first embodiment.

First, at step S1, a reticle 5 to be used in exposure processing is transferred onto the reticle holder 2 by the robot 1. At step S2, alignment is performed based on an outer form shape of the reticle 5 with the thrust pins 3. At step S3, detection of reticle marks and rough alignment (prealignment) are performed by the second image sensing mechanism (40, 41) and the prealignment stage 30. The reticle transfer processing at step S1 and the prealignment processing at steps S2 and S3 can be performed in parallel with alignment of the reticle 6 on the reticle stage 10 and exposure processing (steps S11 and S12).

At the timing of reticle exchange, the process proceeds from step S4 to step S5, at which, the pre-aligned reticle is transferred from the prealignment stage 30 to the reticle stage 10 by the reticle exchange hand 4. When the reticle transfer by the reticle exchange hand 4 has been completed, as a used reticle (i.e., a reticle that was subjected to exposure) is placed on the prealignment stage 30, the used reticle is unloaded by the robot 1 (not shown in FIG. 2) at step S6. Thereafter, the process returns to step S1, at which rough alignment is performed on the next reticle. On the other hand, on the reticle stage 10, accurate alignment is performed on the reticle transferred at step S5. That is, at step S11, high-accuracy reticle alignment is realized by the first image sensing mechanism (20, 21). Then, at step S12, the reticle stage 10 moves the aligned reticle to an exposure processing position, and exposure processing is performed on the reticle. When the exposure has been completed, the reticle is returned to the reticle alignment position (the position of reticle transfer from the prealignment stage 30) at step S13, and the reticle exchange hand 4 is notified that transfer is possible.

The reticle exchange hand 4 unloads the used reticle from the reticle stage 10 in response to the notification, and loads a prealigned reticle onto the reticle stage 10 (steps S4 and S5).

The reticle alignment will now be described in more detail.

Figure 3:
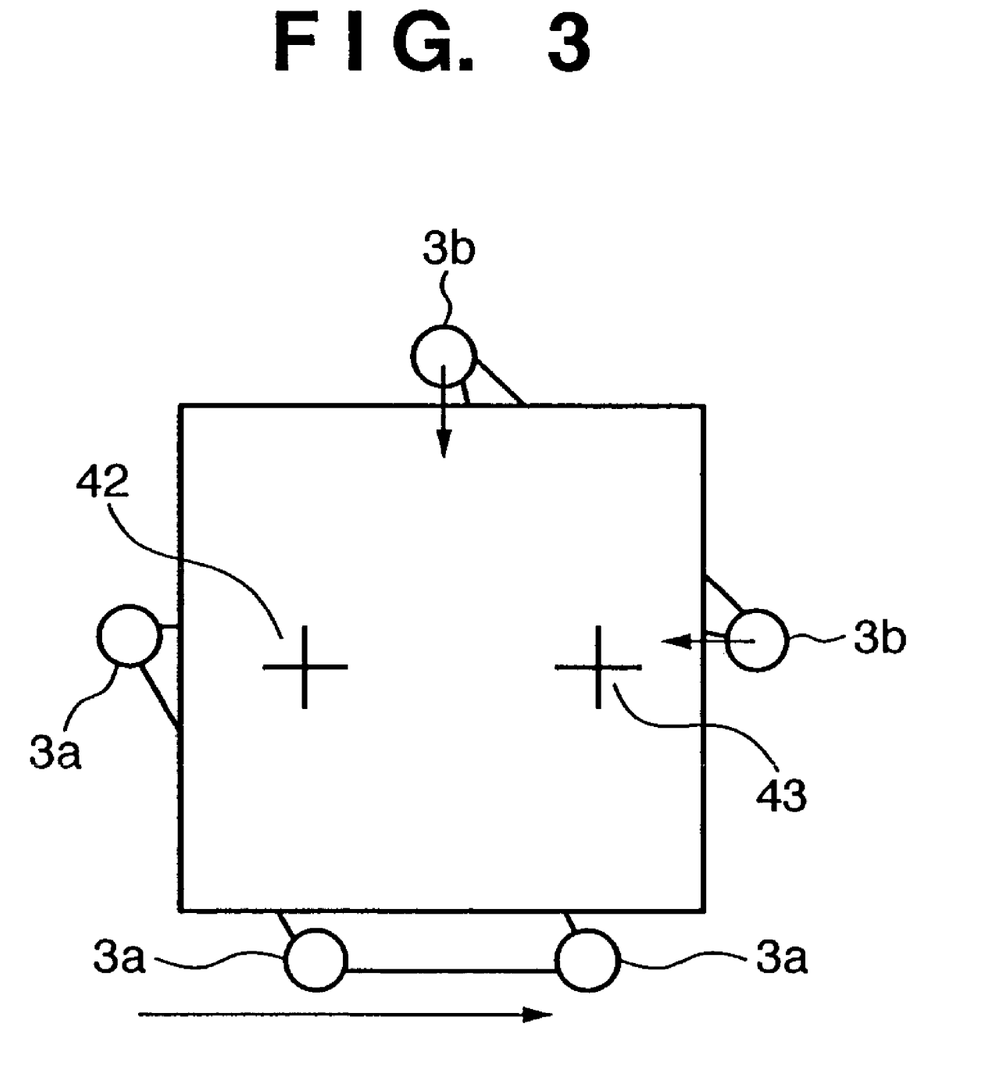
FIG. 3 is a schematic diagram showing the structure of a prealignment stage according to the first embodiment.

First, the reticle transferred by the robot 1 to the reticle holder 2 at step S1 is aligned based on the outer form shape with the thrust pins at step S2. FIG. 3 shows the structure of the reticle holder 2. The reticle alignment with the thrust pins is made by, e.g., with three pins 3a as reference pins, and two pressing pins 3b to the reticle end surfaces. The purpose of the alignment with the thrust pins is bringing the reticle into a predetermined range without measurement of the position of the reticle marks, for efficient prealignment by image sensing. For this purpose, it is desirable that the positional relation between the two sides to abut against the three reference pins 3a and the reticle marks are obtained in advance as reticle information. After the alignment based on the outer form shape with the thrust pins, the reticle holder 2 holds the reticle by, e.g., vacuum clamping the lower surface of the reticle, then the process proceeds to the prealignment at step S3.

To detect the reticle marks aligned based on the outer form shape with the thrust pins without search, the image sensing unit 40 has a wide-view detection range in consideration of the accuracy of the thrust pins 3 and reticle-mark drawing error in each reticle, so as to reliably detect the reticle marks after the execution of step S2. The reticle marks are measured by the second image sensing mechanism (40, 41), and the reticle marks are aligned to reference positions (predetermined camera measurement coordinate positions) 42 and 43.

Figure 4:
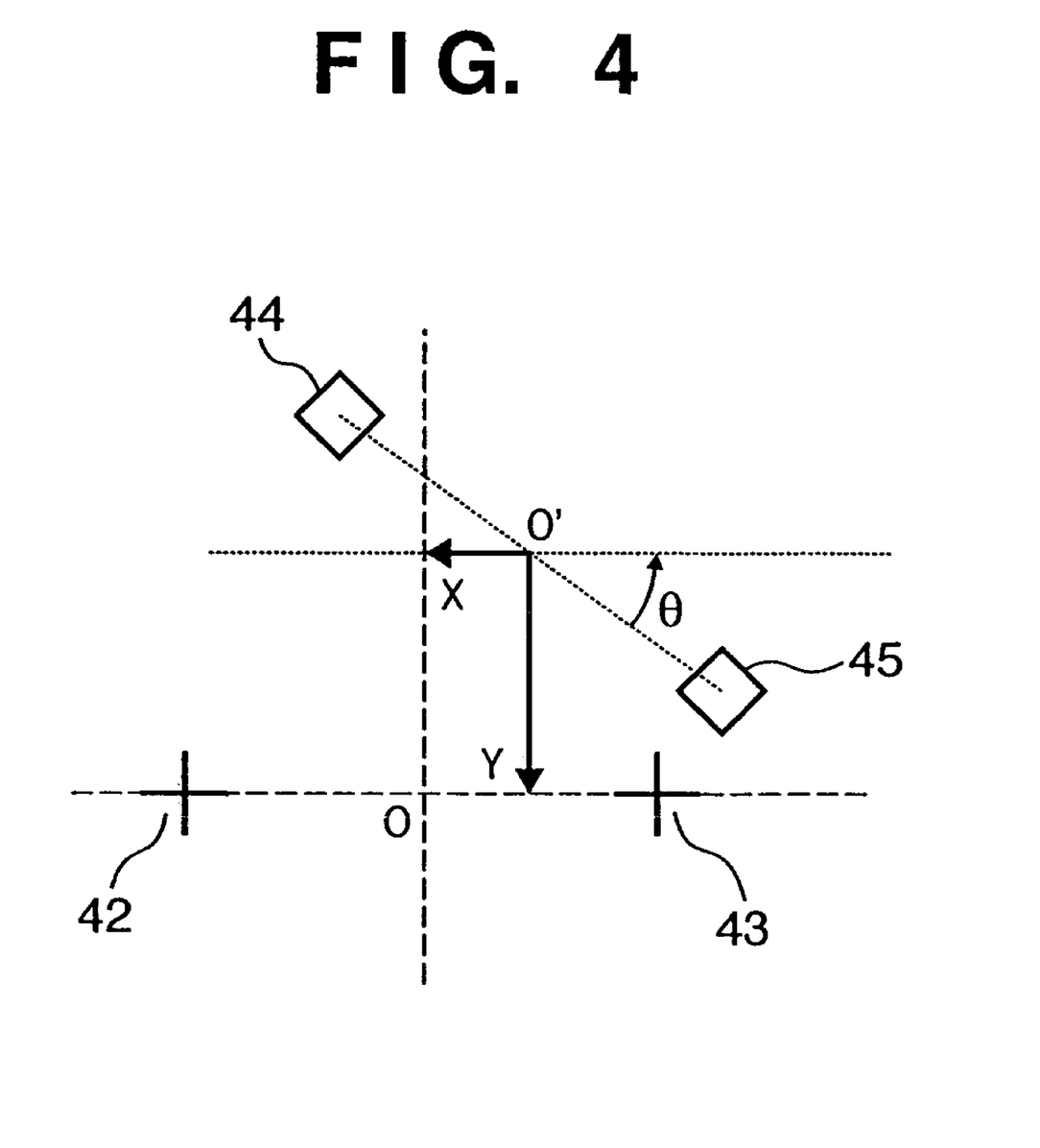
FIG. 4 is a graph showing a calculation of a correction amount according to the first embodiment.

The correction amount in alignment is calculated as shown in FIG. 4. "XYθ" is calculated from the relative positions of the measurement coordinates 42, 43 as the reference position measured by the image sensing units 40 and the reticle marks 44 and 45. Note that "O" denotes a center of a line segment connecting the reticle marks 44 and 45. The value "XYθ" is reflected in the prealignment stage 30 through the control unit 34, thereby, the prealignment stage moves so as to bring the reticle marks to the reference positions. Thus, the prealignment is completed.

After the above rough alignment (prealignment), the reticle is transferred onto the reticle stage 10 by the reticle exchange hand 4 (step S5). At this time, if the amount of driving of the reticle exchange hand 4 is always the same, the positions of the reticle marks on the reticle transferred onto the stage 10 can be measured in approximately the same positions each time. Accordingly, the second image sensing mechanism (40, 41) and the reticle holder 2 have reference positions as reference prealignment positions to bring the reticle marks into a predetermined positional range (the view range of the first image sensing mechanism) upon the reticle transfer by the reticle exchange hand 4. By this arrangement, on the reticle stage 10, as the reticle marks are positioned within the view of the first image sensing mechanism (20, 21) without search of reticle marks, high-accuracy alignment can be immediately performed. Preferably, the reference positions in the reticle holder 2 are brought into correspondence with, e.g., the camera center upon assembly. Further, if such previous setting is difficult, shift amounts from the camera center may be used as offset amounts. The coordinate positions shifted by the offset amounts can be set as reference positions.

When the reticle has been transferred by the reticle exchange hand 4, the reticle marks are image-sensed and measured on the reticle stage 10. Thus, the reticle is finally aligned (step S11). On the reticle stage 10 side, as the mark positions have been obtained by the previous prealignment, high-accuracy reticle alignment can be performed without search for reticle marks by the first image sensing mechanism (20, 21) having a narrower view and higher magnification than the second image sensing mechanism (40, 41). Actually, a shift occurs due to mechanical contact, or the like, upon transfer by the reticle exchange hand 4, and the shift amount can be corrected as an offset amount on the prealignment stage 30 or the reticle stage 10 side. Thus, the reticle alignment can be performed without losing the effect of the prealignment.

Note that the reticle marks measured at step S11 may by the same as or may be different from the reticle marks measured at step S3. That is, it may be arranged such that reticle marks for prealignment are different from reticle marks for final alignment for improvement in accuracy. In this case, the relative positions of the reticle marks used at step S11 and the reticle marks used at step S3 are clearly obtained in advance. Thereby, alignment can be performed without a search for a reticle mark, as in the case of the above embodiment.

Further, after the reticle alignment, the reticle stage 10 moves to the exposure position for execution of exposure processing, while the next reticle is transferred to the reticle holder 2. As described above, as prealignment is performed with the measured coordinate points as reference positions, the reticle marks can be detected without a reticle stage. Accordingly, the prealignment at steps S2 and S3 can be completed during the exposure at step S12. As a result, after the completion of exposure, when the reticle stage 10 returns to the alignment position, only the reticle exchange by the reticle exchange hand 4 and the reticle alignment at step S11 are performed. Thus, the reticle alignment can be very efficiently performed.

Note, that in the above embodiment, the reticle alignment has been described. However, the present invention is applicable to wafer alignment, as well.

As described above, the aligning apparatus according to the first embodiment performs alignment on a first stage (prealignment stage 30, thrust pins 3 and reticle holder 2) and a second stage (reticle stage 10). The apparatus has a first alignment unit (thrust pins 3, image processing unit 33, control unit 34, and second image sensing mechanism 40, 41) to perform alignment on a substrate placed on the first stage to bring marks (reticle marks) on the substrate to predetermined positions, a transfer device (reticle exchange hand 4) to transfer the substrate (reticle) from the first stage to the second stage, and a second alignment unit (image processing unit 31, control unit 32, and first image sensing mechanism 20, 21) to perform alignment with higher accuracy than that of the first alignment unit on the substrate placed on the second stage. The destinations of the marks on the substrate by the transfer device are known, and as the positions of the marks on the substrate are brought to the predetermined positions by the first alignment unit, the marks can be placed to positions appropriate to execution of alignment by the second alignment unit upon transfer of the substrate to the second stage. Thus, the alignment processing by the second alignment unit can be quickly performed. In a case wherein the alignment apparatus is applied to an exposure apparatus, predetermined processing such as exposure processing is performed using the substrate placed on the above second stage. Then, the alignment by the first alignment unit can be performed on a substrate newly placed on the first stage during execution of the alignment by the second alignment unit and/or predetermined processing such as exposure processing.

In this arrangement, as prealignment can be completed during execution of predetermined processing such as exposure processing, the processing time for the substrate alignment can be reduced, and the throughput of the apparatus can be improved.

Further, the first alignment unit includes processing to perform alignment based on the outer form shape of the substrate. As the positions of the reticle marks can be brought into a predetermined range by using the outer form shape, the apparatus structure can be simplified, and the processing speed can be increased. Note that it is necessary to previously obtain relative distances between the positions of reference points of the outer form shape and the mark positions to be measured.

Further, according to the first embodiment, the above first alignment unit performs alignment based on the outer form shape of a substrate (by using the thrust pins), then measures the marks of the substrate by image sensing, thereby performing alignment of the substrate. Especially, in the first embodiment, the first stage is driven based on the result of measurement of the image-sensed marks of the substrate such that the marks are brought to predetermined reference positions (the reticle stage 30 is moved in the XYθ direction).

Further, in the above-described transfer device, to reflect the result of alignment performed on the first stage (prealignment) on the second stage with high accuracy, the substrate holding position on the first stage (reticle holder 2) and the substrate holding position on the second stage (reticle holder 12) are linked with each other. As the relative positional relation between the reference positions of the respective holders are clearly obtained, efficient alignment without search for substrate marks can be realized on the second stage. Note that, since the linkage between the positions of both reticle holders greatly influences the accuracy of mark alignment, it is preferable that reference positions of the image sensing mechanisms in the respective reticle holders are used. Further, as a mechanism to chuck the substrate in the reticle holder, a well-known chuck mechanism such as an electrostatic chuck or a vacuum chuck can be employed.

Further, the above linkage is made for the purpose of clearly obtaining the position to the reference position of the first image sensing mechanism (20, 21), upon the transfer of the substrate, pre-aligned to the reference positions of the second image sensing mechanism (40, 41) in the reticle holder 2, by the reticle exchange hand 4 to the reticle holder 12. As long as the relative position is clearly obtained, even if a positional shift occurs upon reticle transfer, the shift amount is used as an offset amount to the reference position of the reticle holder 2. Thus, the substrate can be approximately accurately transferred to the reference position of the reticle holder 12 (first image sensing mechanism 20, 21).

Second Embodiment

In the first embodiment, prealignment is realized by driving the prealignment stage 30 in the XYθ direction. In the second embodiment, prealignment is realized by fine driving of thrust pins. Thereby, the structure can be simplified.

Figure 5:
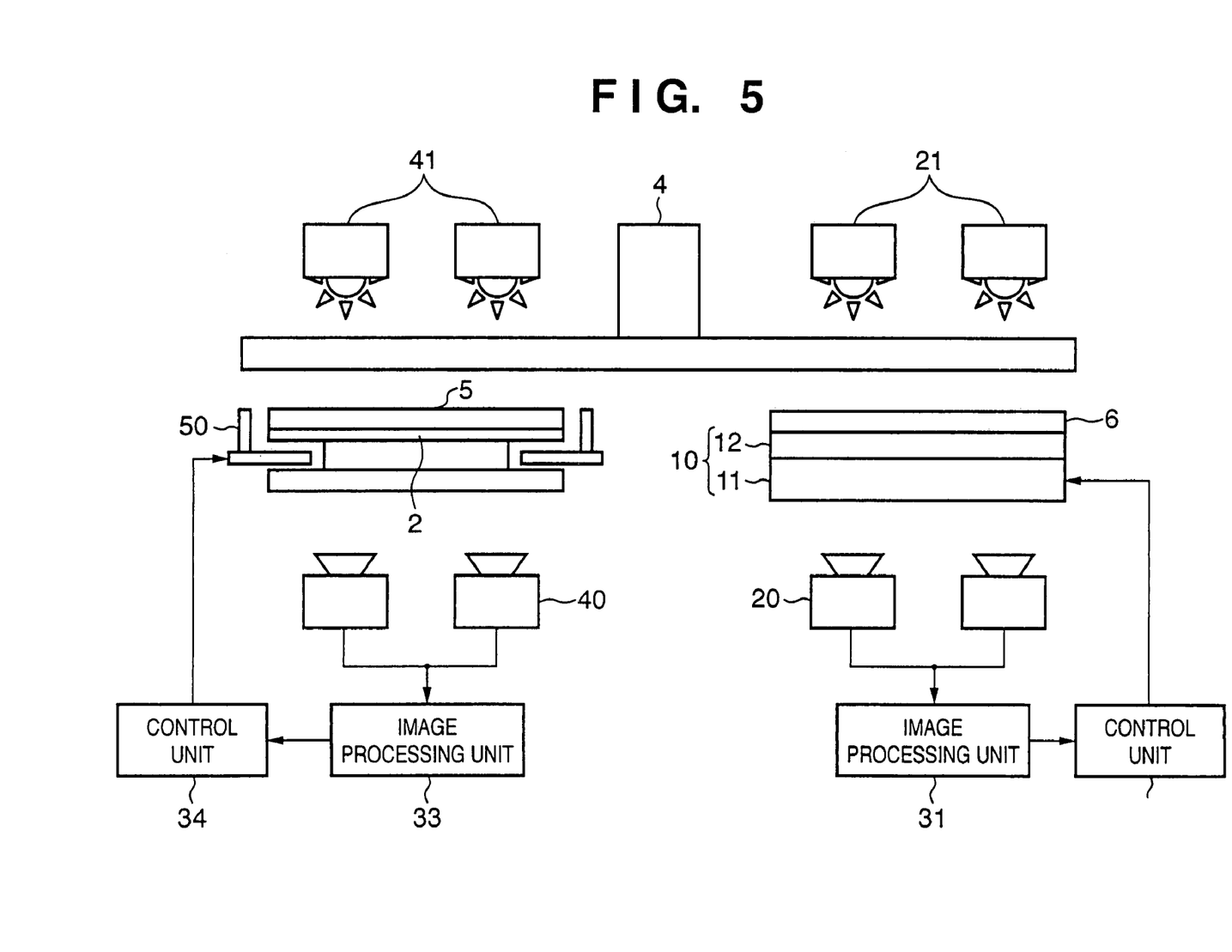
FIG. 5 is a schematic diagram showing the reticle aligning mechanism according a second embodiment of the present invention.

FIG. 5 shows the reticle aligning mechanism according to the second embodiment. The present embodiment is also applied to an exposure apparatus. As in the case of the above embodiment shown in FIG. 2, for the purpose of a detailed explanation of the reticle aligning mechanism, elements of the exposure apparatus such as a projection optical system and a wafer stage are omitted in FIG. 5. The difference from FIG. 2 is that the prealignment stage 30 is not used, but thrust pins 50 (pins 50*a* to 50*d* as shown in FIG. 6), which can be finely driven, are used for prealignment.

Figure 6:
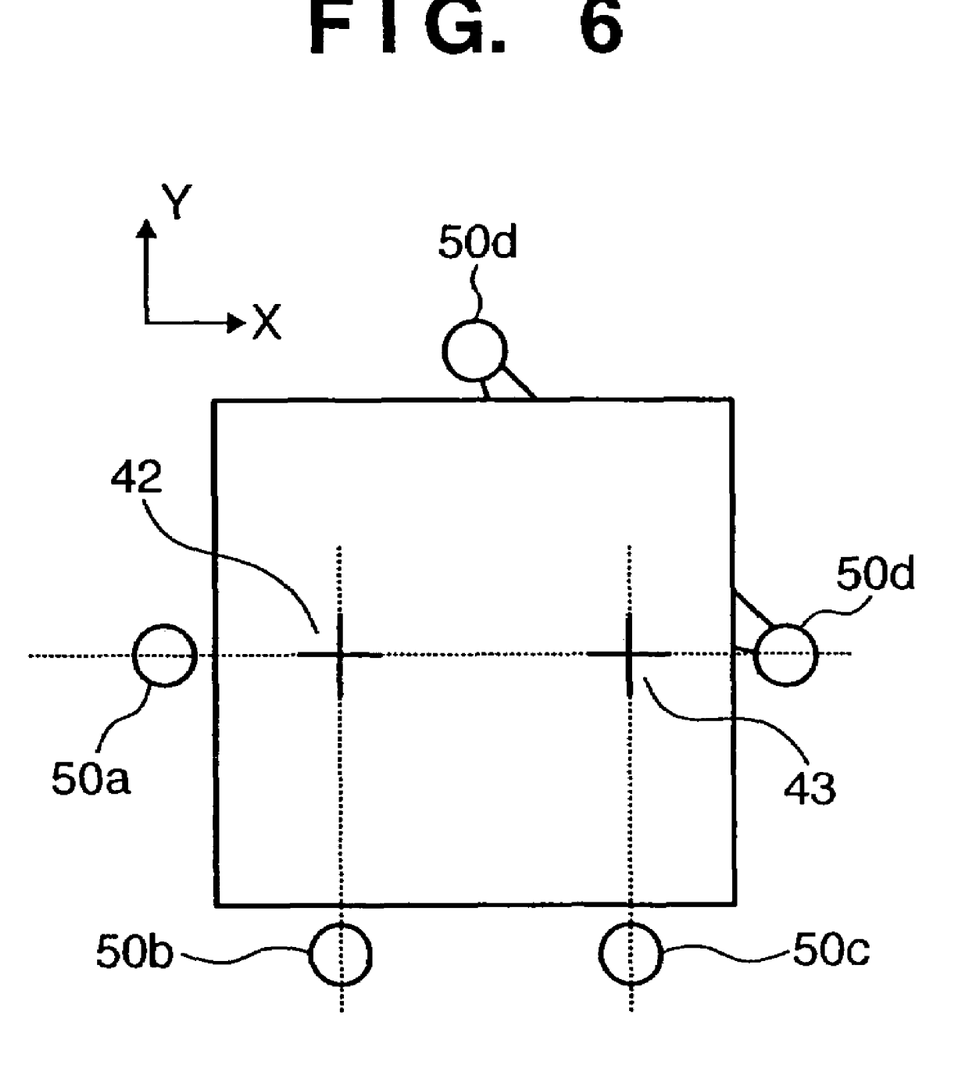
FIG. 6 is a schematic diagram showing the structure of the prealignment stage according to the second embodiment.

FIG. 6 shows the details of the reticle thrust pins 50 shown in FIG. 5. The thrust pin 50*a*, provided on the Y axis of the measurement coordinate system, can be finely driven in the X direction; the thrust pins 50*b* and 50*c*, provided on the X axis of the measurement coordinate system, can be finely driven in the Y direction; and the thrust pin 50*d*, having a spring mechanism between the pin and the driving portion, can absorb fine driving of the pins 50*a*, 50*b* and 50*c*, and distortion of the outer form shape of the reticle.

The entire flow of the exposure processing, including prealignment according to the second embodiment, is as described in the first embodiment (FIG. 8). In the second embodiment, the prealignment processing at steps S2 and S3 is different.

The prealignment according to the present embodiment is performed as follows. First, in a status where the reticle is placed on a stage for prealignment, the thrust pins 50 are moved to predetermined positions so as to abut against the reticle. Thus, the reticle is aligned based on an outer form shape.

Figure 7:
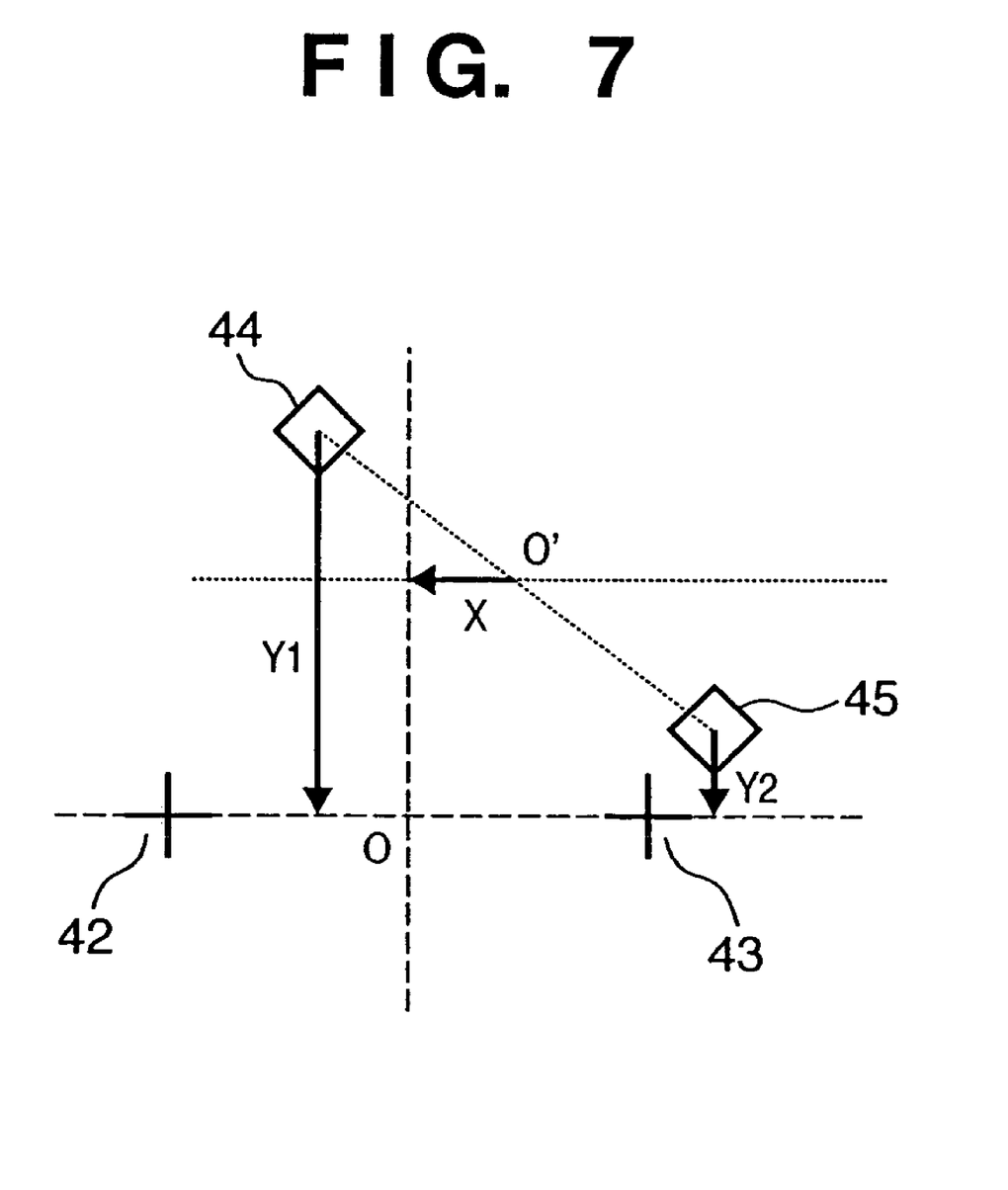
FIG. 7 is a graph showing the calculation of the correction amount according to the second embodiment.

Next, the reticle marks 44 and 45 are measured by the first image sensing mechanism (40, 41) while the reticle in the above status is held. In the second embodiment, the alignment correction amount is calculated as shown in FIG. 7. The correction amount X is reflected in the driving of the pin 50*a*; the correction amount Y1, in the driving of the pin 50*b*; and the correction amount Y2, in the driving of the pin 50*c*, through the image processing unit 33 and the control unit 34. As a result, the reticle marks 44 and 45 can be aligned with the reference positions 42 and 43. In the first embodiment, a rotational component is corrected in the θ directional driving axis. However, in the second embodiment, the rotational component is corrected by independently moving the pins 50*b* and 50*c* by correction amounts Y1 and Y2. All the correction amounts can be obtained from the differences between the reference positions 42, 43 and the reticle mark positions 44, 45. Further, as the correction directions and the operation directions of the driven parts are the same, the structure is intuitive.

In the second embodiment, as actuators are employed only for the four axes of thrust pins, commonality of driving units for the thrust pins and prealignment can be realized. Thereby, further downsizing and weight reduction in comparison with the first embodiment can be attained. Further, in the second embodiment, two measurement reference points and two axes of Y-axis driving units are employed on the assumption of rotational shift. However, in a case wherein correction of rotational shift is unnecessary, one measurement reference point and one Y-axis driving unit may be employed. Thereby, further downsizing and weight reduction can be made.

Further, in the sequence of the entire apparatus operation, merely the processing at steps S2 and S3 is changed. Thus, the flow of reticle exchange is the same as that in the first embodiment. That is, the prealignment at steps S2 and S3 can be completed during exposure. Then, after the completion of exposure, when the reticle stage 10 returns to the alignment reference position, only the reticle exchange by the reticle exchange hand 4 and the final alignment at step S1 are performed. Thereby, the reticle alignment is completed. Thus, very efficient reticle alignment can be realized.

As described above, according to the second embodiment of the first embodiment, the first stage, including the prealignment stage 30, the thrust pins 3 and the reticle holder 2, is constituted with the thrust pins 50 and the reticle holder 2. The image sensing and measurement are performed on the reticle marks. Then, based on the result of the measurement, the reticle is further aligned based on the outer form shape (by using thrust pins) such that the marks are brought to predetermined reference positions. In the second embodiment, as the prealignment stage 30 can be omitted, the structure can be simplified.

As described above, according to the above respective embodiments, reticle alignment and prealignment can be realized with high alignment accuracy, without a search for a mark, and further, prealignment in parallel with an exposure operation can be realized. Accordingly, the entire throughput of the exposure apparatus can be improved.

As described above, according to the present invention, substrate alignment with high alignment accuracy to attain high throughput can be realized.

As many apparently widely different embodiments of the present invention can be made without departing from the spirit and scope thereof, it is to be understood that the invention is not limited to the specific embodiments thereof except as defined in the appended claims.

What is claimed is:

1. An exposure apparatus for aligning a reticle and performing exposure using the aligned reticle, said apparatus comprising:
   a first positioning system having a first stage, a positioning unit adapted to position the reticle mounted on the first stage based on an outer shape of the reticle, and a first image sensing unit adapted to detect a position of a pair of marks patterned on a surface of the reticle positioned by the positioning unit;
   a second positioning system having a second stage and a second image sensing unit adapted to detect a position of the pair of marks on the reticle mounted on the second stage; and
   a transfer system adapted to transfer the reticle from the first stage to the second stage,
   wherein magnification of the second image sensing unit is higher than that of the first image sensing unit.

2. The apparatus according to claim 1, wherein the first positioning system, the second positioning system and the transfer system are arranged so that the pair of marks on the reticle that has been positioned based on its outer shape by the positioning unit come in sight of the first image sensing unit, and the pair of marks on the reticle that has been positioned based on a detection result of the first image sensing unit and transferred from the first stage to the second stage by the transfer unit come in sight of the second image sensing unit.

3. An exposure apparatus for aligning a reticle and performing exposure using the aligned reticle, said apparatus comprising:
   a first positioning system having a first stage and a first image sensing unit adapted to detect a position of a first mark patterned on a surface of the reticle mounted on the first stage, wherein the first positioning system further comprises a positioning unit adapted to position the reticle mounted on the first stage based on an outer shape of the reticle before detection by the first image sensing unit;
   a second positioning system having a second stage and a second image sensing unit adapted to detect a position of a second mark, which is different from the first mark, patterned on a surface of the reticle mounted on the second stage; and
   a transfer system adapted to transfer the reticle from the first stage to the second stage,
   wherein magnification of the second image sensing unit is higher than that of the first image sensing unit.

4. The apparatus according to claim 3, wherein the first mark has a pair of marks, and the first image sensing unit detects position of the pair of marks.

5. The apparatus according to claim 3, wherein the first positioning system, the second positioning system and the transfer system are arranged so that the second mark on the reticle that has been positioned based on a detection result of the first image sensing unit and transferred from the first stage to the second stage comes in sight of the second image sensing unit.

6. The apparatus according to claim 3, wherein the first positioning system is capable of performing a positioning process for a reticle newly mounted to the first stage, while the second positioning system is performing a positioning process.

7. The apparatus according to claim 3, further comprising an exposure system adapted to perform an exposure process using the reticle mounted on the second stage,
   wherein the first positioning system is capable of performing a positioning process for a reticle newly mounted to the first stage while the second positioning system is performing a positioning process or the exposure system is performing the exposure process.

8. The apparatus according to claim 3, wherein the first positioning system positions the reticle by driving the first stage based on a detection result of the first image sensing unit.

9. The apparatus according to claim 3, wherein the first positioning system positions the reticle, based on a detection result of the first image sensing unit, using a thrust member for pressing an outer shape of the reticle.

10. The apparatus according to claim 3, wherein the second positioning system positions the reticle by driving the second stage based on a detection result of the second image sensing unit.

11. An exposure method comprising the steps of:
    positioning a reticle mounted on a first stage based on an outer shape of the reticle, and detecting a position of a pair of marks patterned on a surface of the reticle using a first image sensing unit;
    positioning the reticle based on a detection result of the first image sensing unit;
    transferring the reticle from the first stage to a second stage;
    detecting a position of the pair of marks on the reticle mounted on the second stage using a second image sensing unit;
    positioning the reticle based on a detection result of the second image sensing unit; and
    exposing a pattern of the reticle to a substrate,
    wherein magnification of the second image sensing unit is higher than that of the first image sensing unit.

12. An exposure apparatus for aligning a reticle and performing exposure using the aligned reticle, said apparatus comprising:
    a first positioning system having a first stage and a first image sensing unit adapted to detect a position of a first mark patterned on a surface of the reticle mounted on the first stage, wherein the first mark has a pair of marks, and the first image sensing unit detects position of the pair of marks;
    a second positioning system having a second stage and a second image sensing unit adapted to detect a position of a second mark, which is different from the first mark, patterned on a surface of the reticle mounted on the second stage; and
    a transfer system adapted to transfer the reticle from the first stage to the second stage,
    wherein magnification of the second image sensing unit is higher than that of the first image sensing unit.

13. The apparatus according to claim 12, wherein the first positioning system further comprises a positioning unit adapted to position the reticle mounted on the first stage based on an outer shape of the reticle before detection of the first image sensing unit.

14. The apparatus according to claim 12, wherein the first positioning system, the second positioning system and the transfer system are arranged so that the second mark on the reticle that has been positioned based on a detection result of the first image sensing unit and transferred from the first stage to the second stage comes in sight of the second image sensing unit.

15. The apparatus according to claim 12, wherein the first positioning system is capable of performing a positioning process for a reticle newly mounted to the first stage, while the second positioning system is performing a positioning process.

16. The apparatus according to claim 12, further comprising an exposure system adapted to perform an exposure process using the reticle mounted on the second stage,
    wherein the first positioning system is capable of performing a positioning process for a reticle newly mounted to the first stage while the second positioning system is performing a positioning process or the exposure system is performing the exposure process.

17. The apparatus according to claim 12, wherein the first positioning system positions the reticle by driving the first stage based on a detection result of the first image sensing unit.

18. The apparatus according to claim 12, wherein the first positioning system positions the reticle, based on a detection result of the first image sensing unit, using a thrust member for pressing an outer shape of the reticle.

19. The apparatus according to claim 12, wherein the second positioning system positions the reticle by driving the second stage based on a detection result of the second image sensing unit.

* * * * *